United States Patent [19]

Cave et al.

[11] Patent Number: 5,563,533
[45] Date of Patent: Oct. 8, 1996

[54] METHOD AND APPARATUS FOR A HIGH SPEED LOW POWER COMPARATOR USING POSITIVE FEEDBACK

[75] Inventors: Michael D. Cave, Pfugerville; Mauricio A. Zavaleta, Austin, both of Tex.

[73] Assignee: Motorola, Inc., Schaumburg, Ill.

[21] Appl. No.: 396,390

[22] Filed: Feb. 28, 1995

[51] Int. Cl.[6] .......................... H03K 3/023; H03K 5/22; H03K 3/037

[52] U.S. Cl. .................... 327/67; 327/55; 327/57; 327/64; 327/71; 327/205; 327/208; 327/215

[58] Field of Search ........................ 327/51, 57, 55, 327/65, 67, 208, 215, 219, 225, 387, 63, 64, 68, 52, 71, 205, 206, 203, 214

[56] References Cited

U.S. PATENT DOCUMENTS 4,602,167  7/1986  Yukawa .................... 327/208
4,845,675  7/1989  Krenik et al. .................... 327/57
5,245,223  9/1993  Lim et al. .................... 327/51

*Primary Examiner*—Timothy P. Callahan
*Assistant Examiner*—Terry L. Englund

[57] ABSTRACT

A comparator (10) provides a high speed comparison between at least two input signals and includes at least two stages (12) and (14). Each stage (12 and 14) includes a pair of transistors (24), a complementary pair of transistors (28) and an enabling transistor (26). The stages are coupled to provide positive feedback back to the first stage (12). A controller (15) operably couples to the enabling transistors. When the first input signal (16) is at a higher voltage level than the second input signal (18), the first comparison output (20) goes low. Conversely, when the second input signal (18) is at a higher voltage level than the first input signal (16), the second comparison output (22) goes low. When the first comparison output (20) goes low, the second enabling transistor (34) is disabled by the controller (15). When the second comparison output goes low, the first enabling transistor (26) is disabled by the controller (15).

17 Claims, 6 Drawing Sheets

5,563,533

METHOD AND APPARATUS FOR A HIGH SPEED LOW POWER COMPARATOR USING POSITIVE FEEDBACK

TECHNICAL FIELD OF THE INVENTION

This invention relates generally to integrated circuitry and more particularly to circuitry used in the comparison of signals.

BACKGROUND OF THE INVENTION

Comparators are commonly used in integrated circuits (ICs) to compare voltage levels of input signals and produce output signals indicating the result of the comparison. The comparator output typically provides a basis for further switching in the IC.

One particular type of comparator is a window comparator. Window comparators are used for, among other things, the control of voltage regulation circuitry. In a window comparator, an input signal is compared to a high window level and a low window level. When the input signal level exceeds the high level, a first signal is produced. When the input signal level is between the high window level and low window level, a second signal is produced. Finally, when the input signal level is below the low window level, a third signal is produced. Thus, when the input signal is a voltage to be controlled, the signals produced by the window comparator may be used to regulate the voltage of the input signal.

Comparators may be constructed in many different manners. For example, an operational amplifier may be configured to compare two input signals, the operational amplifier producing a first signal when a first input signal level exceeds a second input signal level and a second signal when the second input signal level exceeds the first input signal level. While functioning reliably, the operational amplifiers operate slowly and can consume large amounts of current. Thus, in today's high-speed, low-power circuits, operational amplifier comparator implementations are inadequate.

Other comparator configurations have thus been developed in an attempt to increase speed and reduce power. One particular implementation employed fast stabilizing latches to provide high speed comparisons. The high speed latches, however, were high current consumers. Therefore, differential input sections were coupled to the high speed latches to reduce the latches current consumption. Even with the differential input sections, however, the configuration still consumed current at levels that exceed the requirements of low power ICs.

Thus, there is a need for a comparator circuit that operates at high speeds and be capable of comparing a plurality of signals so that it may be used in common IC circuitry.

DESCRIPTION OF PREFERRED EMBODIMENTS

Generally, the present invention provides a low-power and high-speed comparator and method of operation. More particularly, the present invention provides a comparator having a plurality of stages interoperably coupled to produce positive feedback for comparison purposes and controlled to prevent current drain through a non-active stage. In this fashion, the comparator of the present invention compares signals to produce a high-speed output but still prevents current drain, thereby reducing power consumption.

Figure 1:
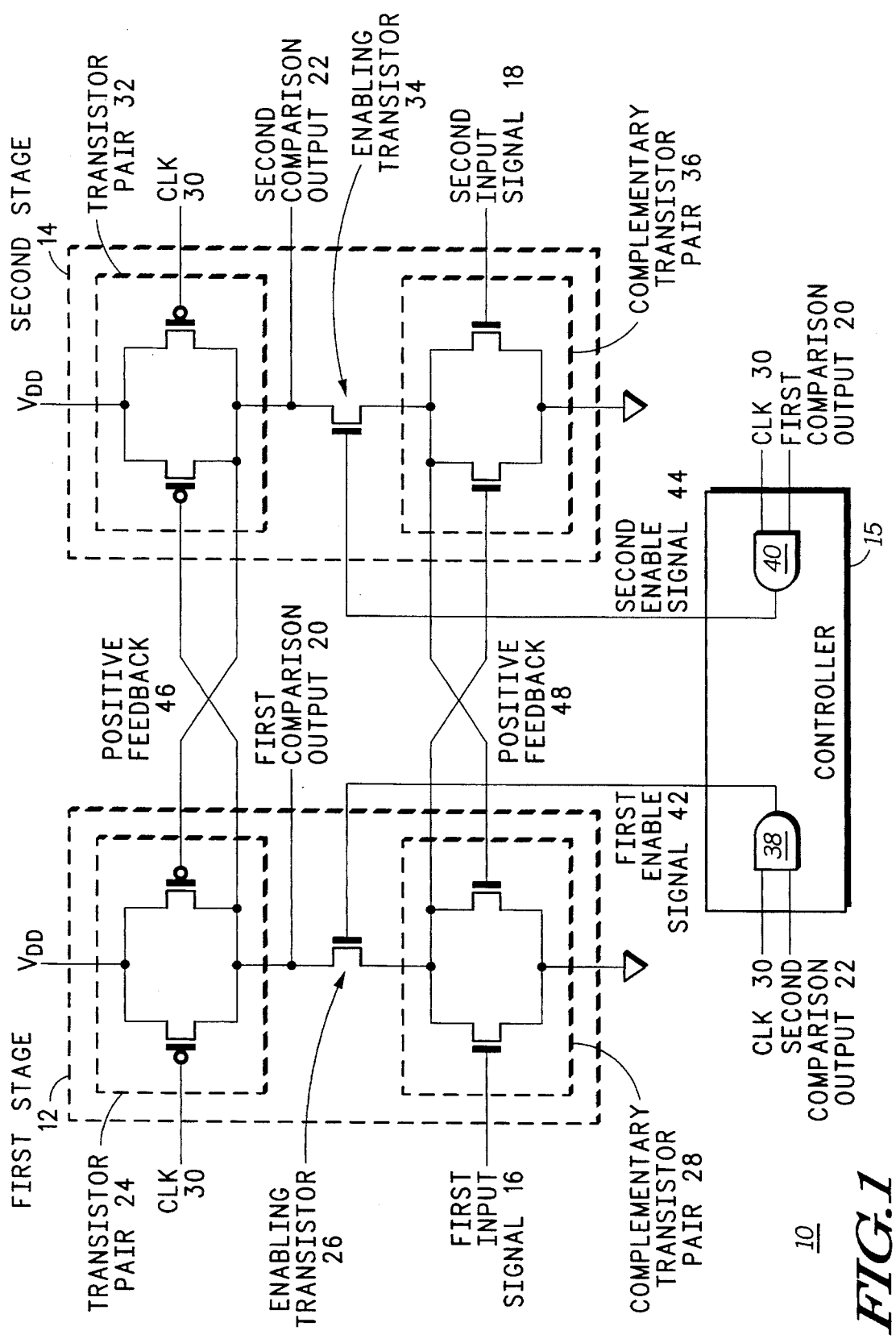
FIG. 1 illustrates a block diagram of a low power comparator in accordance with the present invention.

FIG. 1 illustrates a low power comparator 10 incorporating the teachings of the present invention. Preferably, the low power comparator 10 comprises a first stage 12, a second stage 14, and a controller 15. These components work in conjunction to provide a high speed comparison between a first input signal 16 and a second input signal 18. When the voltage level of the first input signal 16 exceeds the voltage level of the second input signal 18 a first comparison output 20 is produced. When the voltage level of the second input signal 18 exceeds the voltage level of the first input signal 16, a second comparison output 22 is produced.

Preferably, the first stage 12 comprises a first pair of transistors 24, a first enabling transistor 26, and a first pair of complementary transistors 28. Preferably, the first pair of transistors 24 include a pair of P-channel field effect transistors (FET) connected in parallel with their sources connected to a reference voltage $V_{DD}$. The enabling transistor 26 preferably comprises an N-channel FET having its drain connected to the drains of the first pair of transistors 24. Preferably, the first pair of complementary transistors 28 comprises a pair of N-channel FETs connected in parallel with their sources connected to a reference ground and their drains connected to a source of the first enabling transistor 26.

The second stage 14 preferably comprises a second pair of transistors 32, a second enabling transistor 34, and a second pair of complementary transistors 36. Preferably, the first pair of transistors 32 comprises two P-channel FETs connected in parallel with their sources connected to a reference voltage $V_{DD}$, and their drains connected to a drain of the second enabling transistor 34. Preferably, the second pair of complementary transistors 36 comprise a pair of N-channel FETs connected in parallel so that their sources connect to a reference ground and their drains connect to the source of the enabling transistor 34. While FETs may be preferred, it should be readily apparent to one skilled in the art that pnp bipolars and npn bipolars could be used in the pair of transistors 24 or 32 and the pair of complementary transistors 28 or 36, respectively. The skilled artisan will also recognize that the pair of transistors 24 or 32 could be N-channel FETs, while the enabling transistor 26 or 34 and the pair of complementary transistors 28 or 36 could be P-channel FETs.

The first pair of transistors 24 interoperably couple to the second pair of transistors 32 so that they provide positive feedback 46 to each other. Preferably, a gate of one of the first pair of transistors 24 connects to a drain of one of the second pair of transistors 32. Further, preferably, a gate of one of the second pair of transistors 32 connects to the drain of one of the first pair of transistors 24. In this fashion, positive feed back 46 is provided between the first pair of transistors 24 and the second pair of transistors 32 such that when one stage is turning on it is helping the other stage to turn off more quickly and vice versa.

The first pair of complementary transistors 28 also interoperably couples to the second pair of complementary transistors 36 to provide positive feedback 48 between the transistor pairs. Preferably a gate of one of the first pair of complementary transistors 28 couples to a drain of one of the second pair of complementary transistors 36. Further, preferably, a gate of one of the second pair of complementary transistors 36 connects to a drain of one of the first pair of complementary transistors 28. In this fashion, positive feed back 48 exists between the first pair of complementary transistors 28 and the second pair of complementary transistors 36 for use in the comparison process.

The first input signal 16 couples to a gate of one of the first pair of complementary transistors 28. The second input signal 18 couples to a gate of one of the second pair of complementary transistors 36. Clock signal 30 couples to a gate of one of the first pair of transistors 24 and to a gate of one of the second pairs of transistors 32 to precharge the first comparison output 20 and the second comparison output 22 to the reference voltage level $V_{DD}$ during a logic low portion of the clock signal 30.

The controller 15 preferably comprises a first AND gate 38 and a second AND gate 40. Clock signal 30 and the second comparison output 22 input to AND gate 38 while the output of AND gate 38 provides a first enable signal 42 as a gating signal of the first enabling transistor 26. Clock signal 30 and the first comparison output 20 input to the second AND gate 40 while the output of AND gate 40 provides a second enable signal 44 which serves as a gating signal to the second enabling transistor 34. The controller 15 operates to prevent current drain through a non-active stage of the converter 10 during a comparison cycle.

Figure 2:
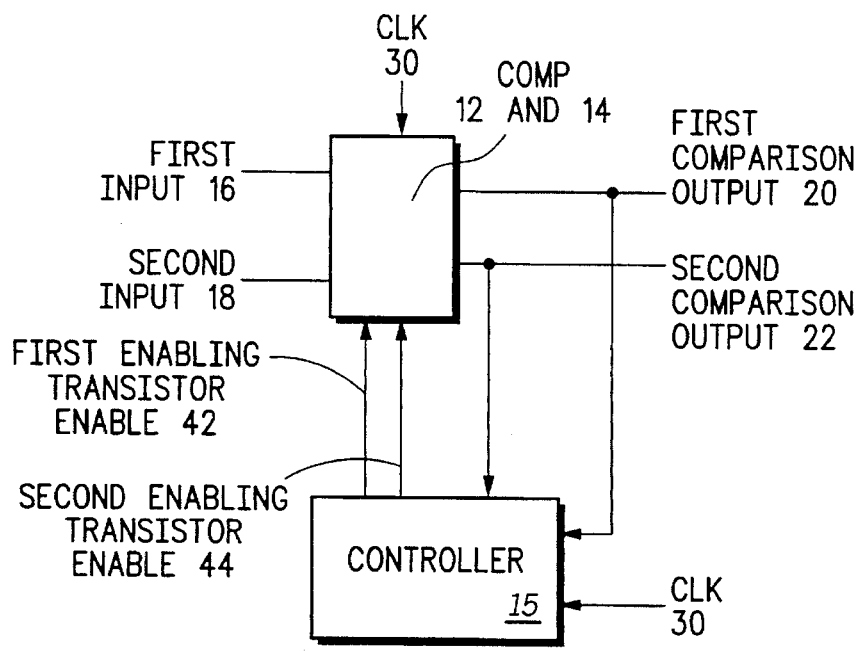
FIG. 2 illustrates a block diagram of an equivalent circuit of the low power comparator in accordance with the present invention.

FIG. 2 illustrates a block diagram of an equivalent circuit of the low power comparator 10. The low power comparator 10 operates to compare the first input signal 16 to the second input signal 18 on a logic high portion of the clock signal 30. When the first input signal 16 is at a higher voltage level than the second input signal 18, the comparator produces a first comparison output 20. Alternatively, when the second input signal 18 is at a higher voltage than the first input 16, the comparator 10 produces a second comparison output 22. Preferably the first comparison output 20 and second comparison output 22 are active at a logic low level.

The first comparison output 20, the second comparison output 22, and the clock signal 30 serve as inputs to controller 15. During a comparison operation, the controller 15 disables one of the stages, 12 or 14, to minimize the current drain of the comparator 10. Thus, controller 15 produces a first enabling transistor enable 42 that causes the first stage 12 to remain enabled when required and produces a second enabling transistor enable 44 that causes the second stage 14 to remain enabled when required.

Figure 3:
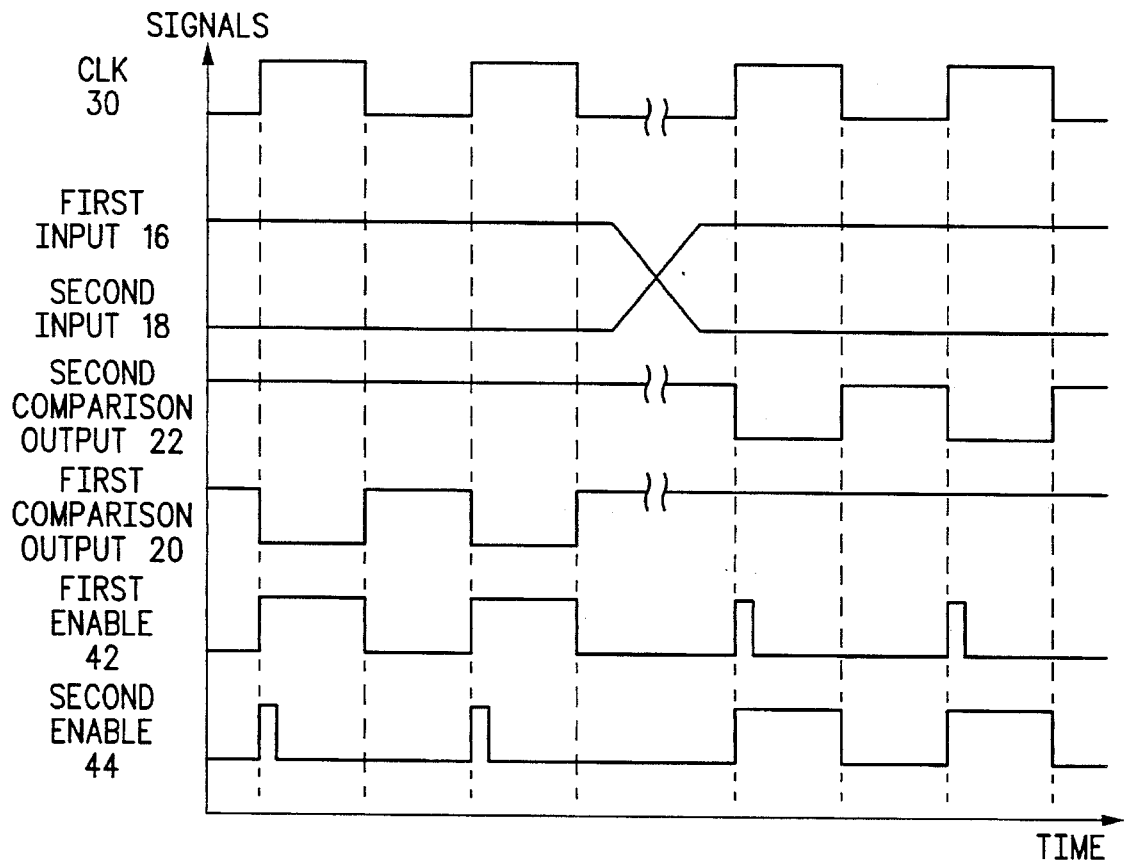
FIG. 3 illustrates a timing diagram of signals coupled to and produced by the low power comparator in accordance with the present invention.

FIG. 3 illustrates a timing diagram of signals coupled to and produced by the low power comparator 10 during its operation. With reference FIG. 1, FIG. 2, and FIG. 3, the operation of the low power comparator 10 is described. Clock signal 30 preferably has a 50% duty cycle and serves to precharge the first comparison output 20 and the second comparison output 22. During a logic low portion of the clock signal 30, at least one of the first pair of transistors 24 and at least one of the second pair of transistors 32 are turned on by clock signal 30 while the first enabling transistor 26 and the second enabling transistor 34 are turned off by the controller 15. Thus, both the first comparison output 20 and the second comparison output 22 are precharged to a logic high level $V_{DD}$.

With specific reference to a left-half portion of FIG. 3, the operation of the comparator 10 when the first input signal 16 is at a higher voltage level than the second input signal 18 is described. When clock signal 30 goes high, both the first comparison output 20 and second comparison output 22 are at logic high levels. Thus, the first enable signal 42 and the second enable signal 44 are at logic high levels and the first enabling transistor 26 and second enabling transistor 34 are turned on. Because the first input signal 16 is at a higher voltage level than the second input signal 18, the positive feedback 48 causes the first pair of complementary transistors 28 to turn on more quickly than the second pair of complementary transistors 36 and, resultantly, to turn off the second pair of complementary transistors 36. Thus, the first comparison output 20 is pulled down to a logic low level immediately while the second comparison output 22 remains at a logic high level. The logic low level at the first comparison output 20 and the positive feedback 46 causes at least one of the second transistor pair 32 to turn on holding the second comparison 22 at a logic high level. Also, the logic high level at the second comparison output 22 and the positive feedback 46 causes the first pair of transistors 24 to be turned off allowing the first comparison output 20 to remain low. In this fashion, the output signals of the comparator quickly seek their stable levels.

Because the second input signal 18 may be above a logic low level, the associated N-channel field effect transistor may remain partially turned-on. Thus during the comparison stage of the operation the comparator 10, current seeks to drain from the source voltage level $V_{DD}$ to the reference ground. Because the first comparison output 20 is logic low, the output of AND gate 40 is logic low and the second enabling transistor 34 is turned off. Therefore, the controller 15 disables the second stage 14 to prevent current from draining through the stage. As shown in FIG. 3 the second enable signal 44 goes logic high for a very short period of time on a rising edge of clock signal 30 and then goes logic low when the first comparison output 20 goes to a logic low level. Alternatively, the first enable signal 42 remains high because both the clock 30 signal and the second comparison output 22 are at a logic high level.

Referring to the right-half portion of FIG. 3, a comparison when the second input 18 in at a higher voltage level than the first input 16 is described. In this comparison, the comparator 10 works in a fashion symmetrical to the operation previously described. When clock signal 30 is logic low, both the first comparison output 20 and second comparison output 22 are precharged to a logic high level by the first pair of transistors 24 and the second pair of transistors 32 respectively. When clock signal 30 goes high, because the second input signal 18 is at a higher voltage level than the first input signal 16, the second pair of complementary transistors 36 turn on more quickly than the first pair complementary transistors 28, the second comparison output goes active low, and the first comparison output 20 remains high. The controller 15 then disables the first enabling transistor 26 to prevent current drain from the reference voltage level $V_{DD}$ to the reference ground through the first stage 12.

Thus, the comparator 10 of the present invention prevents current drain through an inactive stage, 12 or 14, while providing a high speed comparison between the input signals. In this fashion, the comparator 10 of the present invention provides benefits not provided by the prior comparator circuits.

Figure 4:
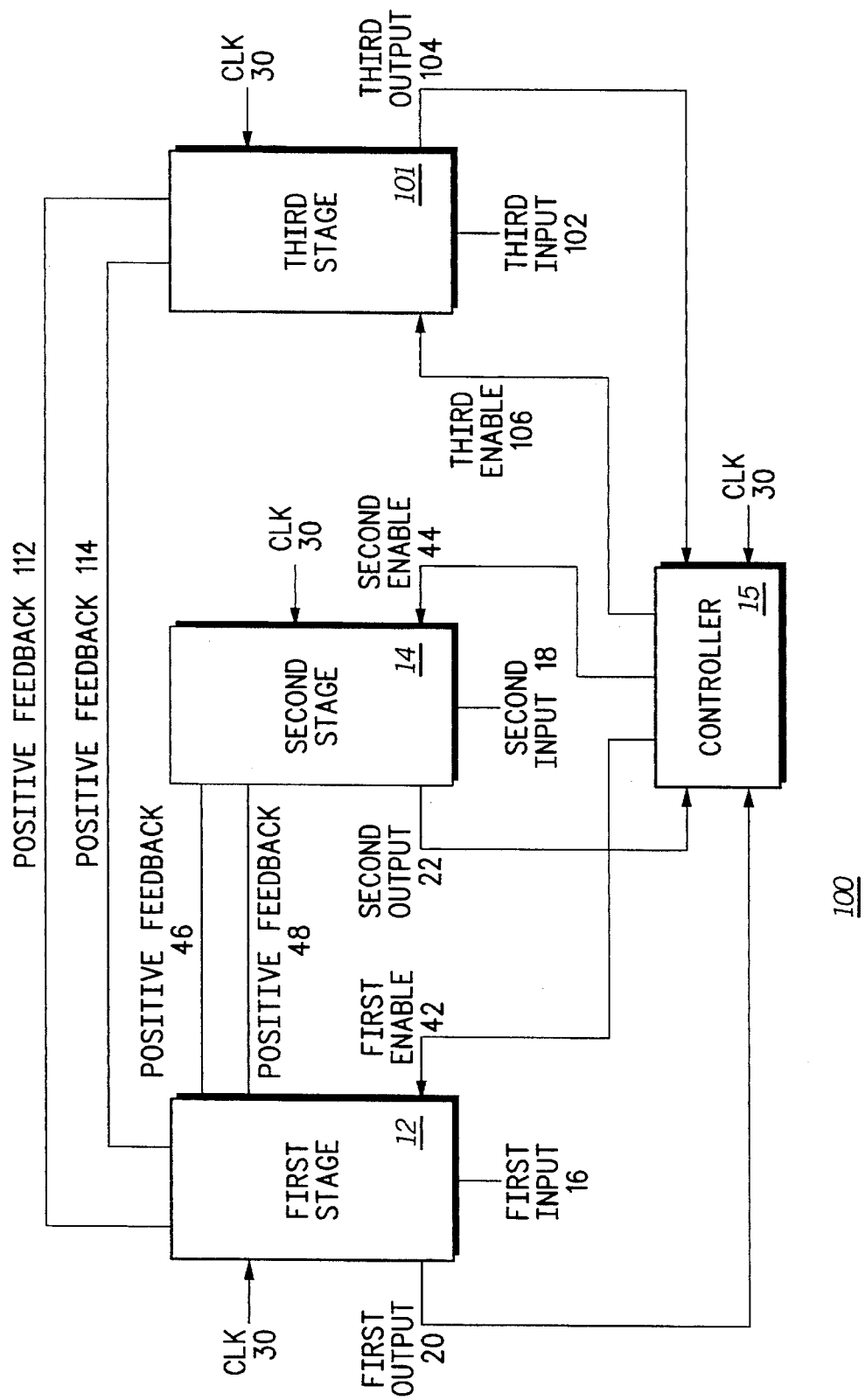
FIG. 4 illustrates a block diagram of a multi-input low power comparator in accordance with the present invention.

FIG. 4 illustrates a low-power, multi-input comparator 100 of the present invention. The numbering convention used in FIG. 4 corresponds to that used in FIG. 1 for elements common to the embodiment. The multi-input low power comparator 100 comprises a first stage 12, a second stage 14, a third stage 101, and a controller 15. The first input signal 16 inputs to the first stage 12, the second input signal 18 inputs to second stage 14, and a third input signal 102 input to the third stage 101. Preferably, the first stage 12, the second stage 14, and the third stage 101 each comprise a pair of transistors and a pair of complementary transistors just as the embodiment of FIG. 1 did. Further, the multi-input low power comparator 100 preferably comprises positive feed back between each of the stages so that signals coupled to any two stages may be compared. The pairs of transistors of the first stage 12 and second stage 14 are interoperably connected to produce positive feed back 46 while the pairs of complementary transistors of the first stage 12 and second stage 14 are interoperably connected to produce positive feedback 48. The pairs of transistors of the first stage 12 and third stage 101 are interoperably connected to produce positive feed back 112 while the pairs of complementary transistors of the first stage 12 and the third stage 101 are interoperably connected to produce positive feedback 114.

Clock signal 30 serves as an input to the first stage 12, the second stage 14, the third stage 101, and the controller 15 in a manner similar to the prior embodiment. The controller 15 selectively enables the first stage 12 via a first enable signal 42, the second stage 14 via a second enable signal 44, and the third stage 101 via a third enable signal 106. The controller 15 receives as its input the first output 20, the second output 22, a third output 104, and clock signal 30. The multi-input low power comparator 100 selectively compares the first input 16 to the second input 18 or the first input 16 to the third input 102. However, one skilled in the art will readily appreciate that the teachings of the present invention could be applied so as to compare the second input 18 to the third input 102 or to any number of stages.

Figure 5:
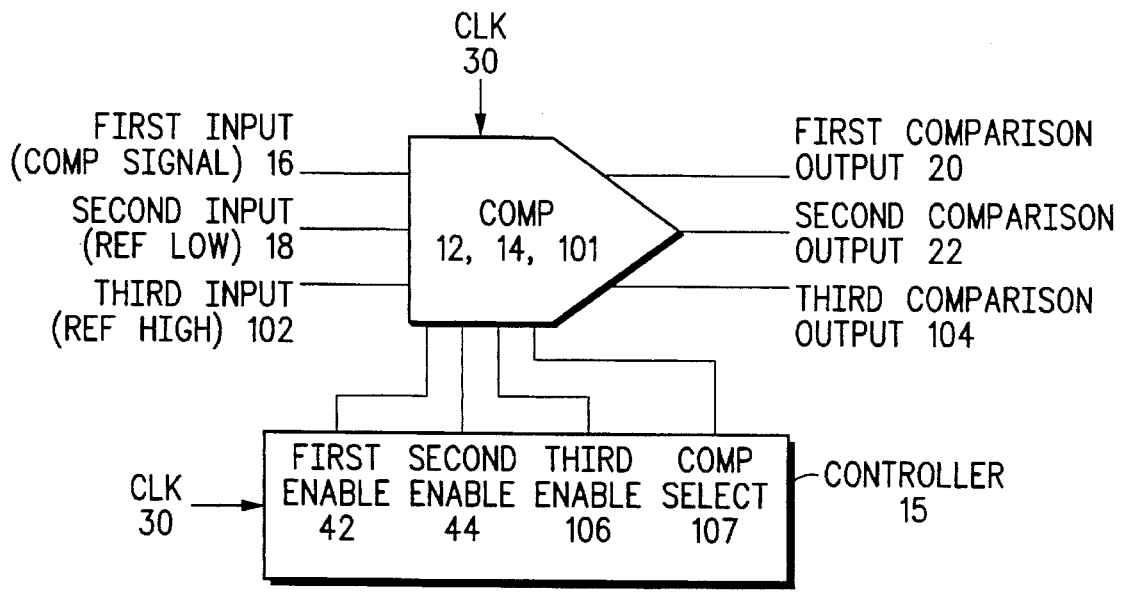
FIG. 5 illustrates a block diagram of an equivalent circuit of the multi-input low power comparator in accordance with the present invention.

FIG. 5 illustrates a block diagram of an equivalent circuit of the multi-input low power comparator 100 wherein the comparator 100 functions as a window comparator. In this manner, the first input signal 16 corresponds to the variable input, the second input signal 18 corresponds to a reference low level, and the third input signal 102 corresponds to a reference high level. Preferably, in a first comparison cycle, the comparator 100 compares the first input 16 to the second input 18 and in a second comparison cycle compares the first input 16 to the third input 102. The controller 15 selectively enables the first stage 12, second stage 14, and third stage 101 so that the comparisons may be made. When the first input signal 16 is compared to the second input signal 18, the controller 15 sets the comparison select signal 107 logic high. When the first input signal 16 is compared to the third input signal 102, the controller 15 sets comparison select signal 107 logic low.

Figure 6:
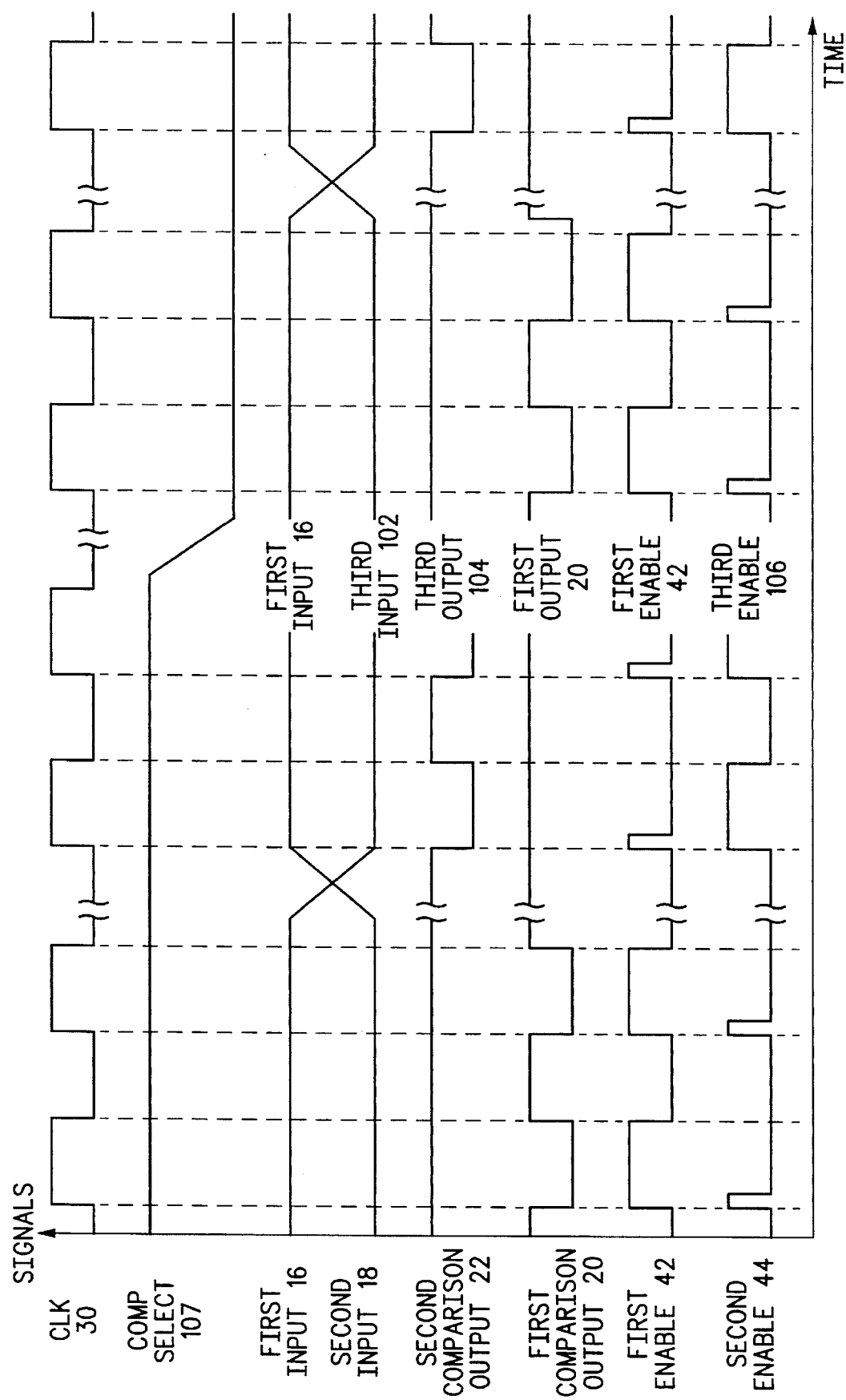
FIG. 6 illustrates a timing diagram of signals coupled to and produced by the multi-input low power comparator in accordance with the present invention.

FIG. 6 illustrates a timing diagram of signals coupled to and produced by the multi-input low power comparator 100. The description of the operation of the multi-input comparator 100 is described with reference to FIG. 4, FIG. 5, and FIG. 6. Referring now to a left portion of the left half FIG. 6, the operation of the comparator 100 is described when a comparison between the first input signal 16 and the second input signal 18 is made. To enable this comparison, the controller 15 sets a comparison select signal 107 to a logic high level to enable the first stage 12 and the second stage 14. In a first comparison, the first input signal 16 is at a higher voltage level than the second input signal 18. As before, when clock signal 30 is logic low, the first comparator output 20 and the second comparator output 22 are precharged to a logic high level. Next, when clock 30 goes logic high, positive feedback 46 and 48 forces the first comparator output 20 to a logic low level, indicating that the first input signal 16 is at a higher voltage level than the second input signal 18. When this occurs, the first enable 42 remains logic high while the second enable 44 goes to a logic low level immediately after the rising edge of clock 30 thereby disabling the second stage 14 and preventing current drain through the second stage 14 of the multi-input comparator 100. Thus, the multi-input comparator 100 operates in a high-speed and low-power manner, providing important benefits over the prior comparators.

Referring now to the right portion of the left haft of FIG. 6, the operation of the comparator 100 is described when the first input signal 16 and second input signal 18 are compared but when the second input signal 18 is at a higher voltage level than the first input signal 16. When clock signal 30 is logic low, both the first comparator output 20 and second comparator output 22 are logic high. However, when clock signal 30 goes logic high, the positive feedback 46 and 48 between the first stage 12 and second stage 14 forces the second comparison output 22 logic low and forces the first comparison output 20 to remain at a logic high level. Resultantly, the first enable 42 is forced to a logic low level soon after clock signal 30 goes logic high thereby disabling the first stage 12 of the multi-input comparator 100 to prevent current drain through the first stage 12 of the comparator. The second enable 18 remains logic high throughout the logic high portion of the clock signal 30.

Referring now to the left portion of the right half of FIG. 6, the first input signal 16 is compared to the third input signal 102. In this condition, comparison select signal 107 is set logic low thus forcing a comparison between the first stage 12 and the third stage 101. In a first comparison, the first input 16 is at a higher voltage level than the third input 102. Therefore, positive feedback 112 and 114 between the first stage 12 and third stage 101 forces the first output 20 to a logic low level when clock 30 goes to a logic high level while holding the third output 104 at a logic high level. Thus, because the third output 104 goes to a logic high level, the controller 15 forces the third enable signal 106 to a logic low level thereby disabling the third stage 101 soon after clock signal 30 goes logic high while continuing to enable the first stage 12. By disabling the third stage 101, current drain through the third stage 101 is prevented.

Referring now to the right portion of the right half of FIG. 6, the condition wherein the third input 102 is at a higher voltage level than the first input 16 is described. While the clock signal 30 is logic low, both the first comparator output 20 and third comparator output 104 are precharged to a logic high level. Then, when clock signal 30 goes logic high, positive feedback 112 and 114 between the first stage 12 and the third stage 101 force the third comparison output 104 logic low while keeping the first comparison output 20 logic high. Resultantly, the controller forces the first enable 16 logic low thereby disabling the first stage 12 and preventing current drain through the stage. Third enable signal 106 remains logic high when clock 30 is logic high, thus allowing the third stage 101 of the multi-input comparator 101 to operate.

Thus, the multi-input comparator 100 of the present invention provides important advantages over the prior devices. It provides a high-speed, low-power comparison between multiple signals wherein the prior devices provided either high-speed operation, low-power operation, or neither.

Figure 7:
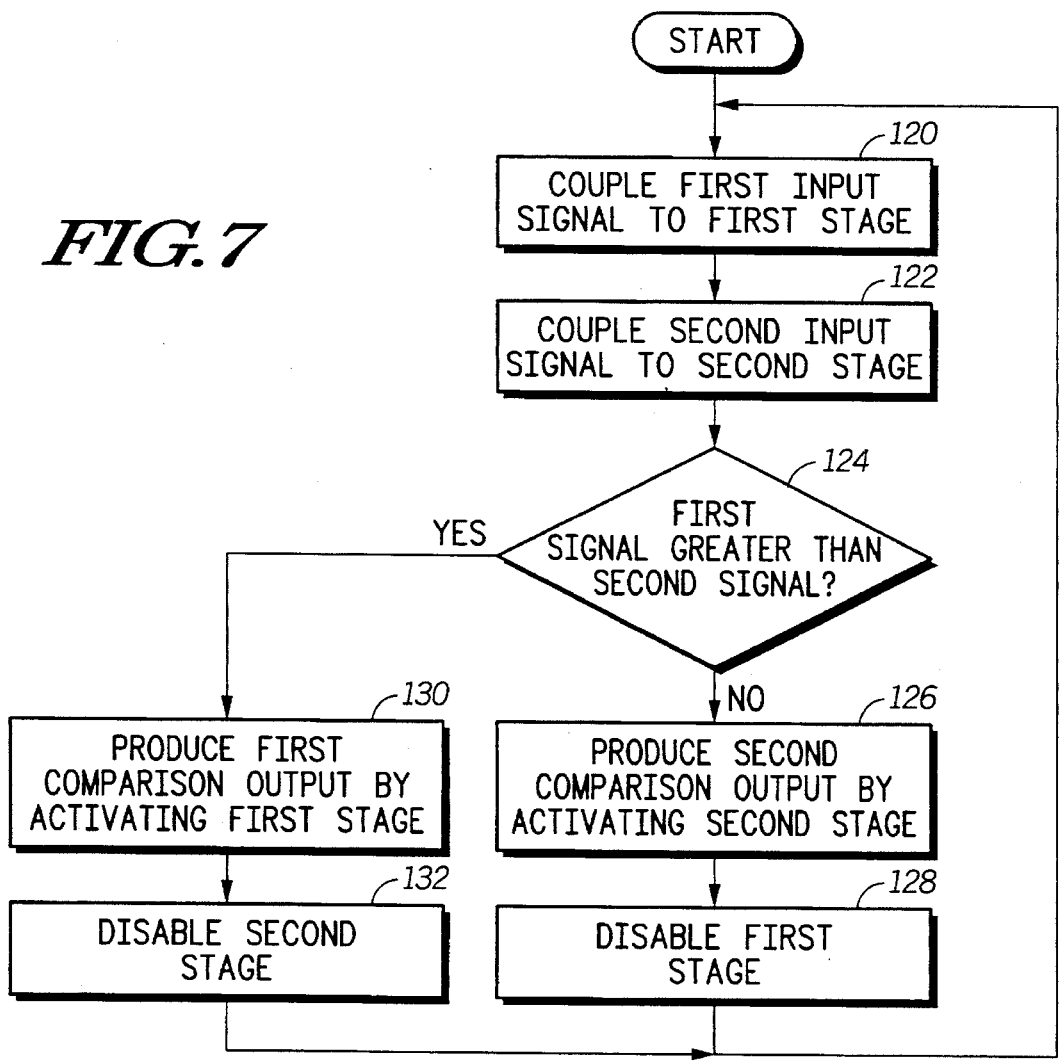
FIG. 7 illustrates a logic diagram of a first preferred embodiment of the method in accordance with the present invention.

FIG. 7 illustrates a first preferred method of operation of a low power comparator 10. The method starts at block 120 wherein a first input signal 16 is coupled to a first stage 12. The method proceeds to block 122 wherein a second input signal 18 is coupled to a second stage 14. Next, at decision block 124, the first signal 16 is compared to the second signal 18, and a determination is made as to whether the first signal 16 is greater than the second signal 18. If the first signal 16 is not greater than the second signal 18, the method proceeds to block 126 wherein a second comparison output 22 is produced by activating the second stage 14. Next, control proceeds from block 126 to block 128, wherein the first stage 12 is disabled to prevent current drain. At decision block 124, if the first signal 16 is greater than the second signal 18, control proceeds to block 130, wherein a first comparison output 20 is produced by activating the first stage 12. From block 130, control proceeds to block 132 wherein the second stage 14 is disabled to prevent current drain through the second stage 14. From both blocks 128 and 132, control returns to block 120, wherein signals are again coupled to the comparator.

Figure 8:
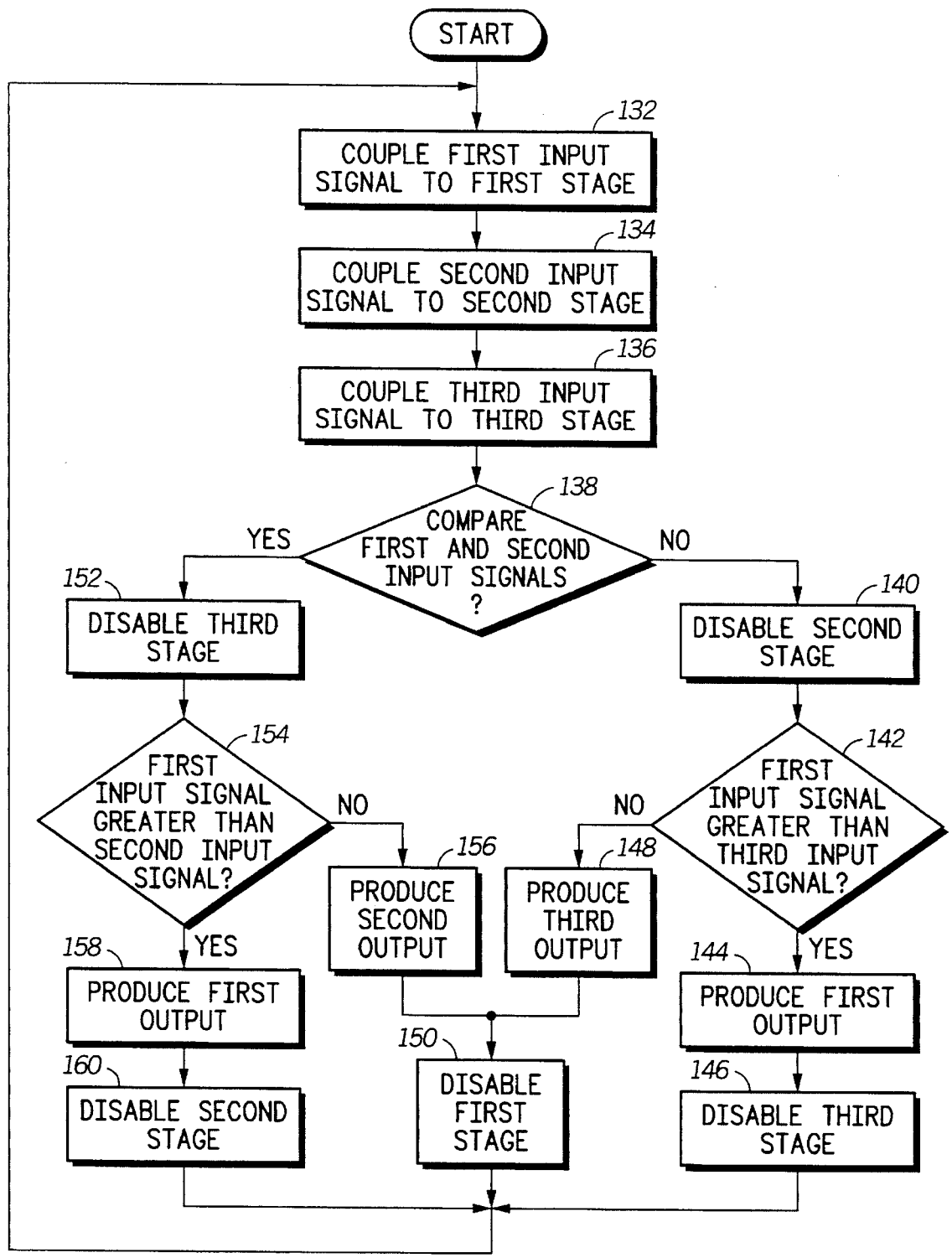
FIG. 8 illustrates a logic diagram of a second preferred embodiment of the method in accordance with the present invention.

FIG. 8 illustrates a method for operating a multi-input comparator 100 in accordance with the present invention. The method starts at block 132, wherein a first input signal 16 is coupled to a first stage 12. Next, at block 134, a second input signal 18 is coupled to a second stage. Then, at block 136, a third input signal 102 is coupled to a third stage 101. Next, control proceeds to decision block 138, where it is determined whether to compare the first signal 16 to the second signal 18 or compare the first signal 16 to the third signal 102. If the first signal 16 level is not to be compared to the second signal 18, control proceeds to block 140, wherein the second stage 14 is disabled. From block 140, control proceeds to decision block 142, wherein the first input signal 16 level is compared to the third input signal 102 level. If the first input signal 16 is greater than third input signal 102 level, control proceeds to block 144, wherein the first output 20 is produced. From block 144, control proceeds to block 146 wherein the third stage 101 is disabled. At decision block 142, if the third input signal 102 is at a higher level than the first input signal 16, control proceeded to block 148, wherein the third output 104 is produced. From block 148, control proceeded to block 150, wherein the first input stage 12 is disabled to prevent current drain through the first input stage 12.

At decision block 138, if the first input signal 16 and second input signal 18 are to be compared, the method proceeds to block 152 wherein the third input stage 101 is disabled. From block 152, the method proceeds to decision block 154. At decision block 154, the first input signal 16 is compared to the second input signal 18. If the first input signal 16 is at a lower voltage level than the second input signal 18, the method proceeds to block 156, wherein the second output 22 is produced. From block 156, the method proceeds to block 150, wherein the first stage 12 is disabled to prevent current drain through the first stage 12. If, in decision block 154, the first input signal 16 is greater than the second input signal 18, the method proceeds to block 158, wherein the first output 20 is produced. From block 158, the method proceeds to block 160, wherein the second stage 14 is disabled to prevent current drain through the second stage 14. From blocks 146, 150, and 160, the method proceeds back to block 132, wherein signals are again coupled to the comparator.

The methods of the present invention provide great advantages of reducing current drain through the comparator during a comparison operation. Unlike prior devices, the method and apparatus of the present invention provide a high speed, low power comparison between signals to provide a digital output. The output signals provided by the comparator may be used in other logic devices wherein further operations are based upon the comparison of signals.

The above described preferred embodiments are intended to illustrate the principles of the invention, but not to limit the scope of the invention. Various other embodiments and modifications to these preferred embodiments may be made by those skilled in the art without departing from the scope of the following claims.

We claim:

1. A low power comparator comprising:
    (a) a first stage that includes a first pair of transistors coupled to a first pair of complementary transistors through a first enabling transistor, wherein one of the first pair of complementary transistors receives a first input signal and one of the first pair of transistors receives a clock signal;
    (b) a second stage that includes a second pair of transistors coupled to a second pair of complementary transistors through a second enabling transistor, wherein one of the second pair of complementary transistors receives a second input signal and one of the second pair of transistors receives the clock signal, wherein the second pair of transistors provides positive feedback to the first pair of transistors and the second pair of complementary transistors provides positive feedback to the first pair of complementary transistors, wherein, when the first input signal is greater than the second input signal, at least one of the first pair of complementary transistors is activated to provide a first comparison output at a drain of the first pair of complementary transistors, and wherein, when the second input signal is greater than the first input signal, at least one of the second pair of complementary transistors is activated to provide a second comparison output at a drain of the second pair of complementary transistors; and
    (c) a controller coupled to the first and second enabling transistors, wherein the controller disables the second enabling transistor while the first enabling transistor is enabled and the first comparison output is a predetermined logic state, and disables the first enabling transistor while the second enabling transistor is enabled and the second comparison output is the predetermined logic state, such that power consumption is minimized.

2. The low power comparator of claim 1 wherein the first and second pair of transistors comprise p-channel field effect transistors and the first and second complementary pair of transistors comprise n-channel field effect transistors.

3. The low power comparator of claim 1 wherein the first and second pair of transistors comprise pnp bipolar transistors and the first and second complementary pair of transistors comprise npn bipolar transistors.

4. The low power comparator of claim 1 wherein the first and second pair of transistors comprise p-channel field effect transistors and the first and second complementary pair of transistors comprise n-channel field effect transistors.

5. The low power comparator of claim 1 wherein the controller provides an enabling signal to the first enabling transistor when the first comparison output is produced and wherein the enabling signal is asserted on a rising edge of the clock signal.

6. The low power comparator of claim 1 wherein the controller provides an enabling signal to the second enabling transistor when the second comparison output is produced and wherein the enabling signal is asserted on a rising edge of the clock signal.

7. The low power comparator of claim 1 wherein the controller comprises at least two AND gates with the controller having the a clock signal, the first comparison output, and the second comparison output as inputs.

8. A multi-input low power comparator comprising:

(a) a first stage that includes a first pair of transistors coupled to a first pair of complementary transistors through a first enabling transistor, wherein one of the first pair of complementary transistors receives a first input signal;

(b) a second stage that includes a second pair of transistors coupled to a second pair of complementary transistors through a second enabling transistor, wherein one of the second pair of complementary transistors receives a second input signal;

(c) a third stage that includes a third pair of transistors coupled to a third pair of complementary transistors through a third enabling transistor, wherein one of the third pair of complementary transistors receives a third input signal, wherein the second and third pair of transistors provide positive feedback to the first pair of transistors and the second and third pair of complementary transistors are coupled to provide positive feedback to the first pair of complementary transistors, wherein, when the first input signal is greater than the second input signal, at least one of the first pair of complementary transistors is activated to provide a first comparison output at a drain of the first pair of complementary transistors, wherein, when the second input signal is greater than the first input signal, at least one of the second pair of complementary transistors is activated to provide a second comparison output at a drain of the second pair of complementary transistors, wherein, when the first input signal is greater than the third input signal, at least one of the first pair of complementary transistors is activated to provide the first comparison output, wherein, when the third input signal is greater than the first input signal, at least one of the third pair of complementary transistors is activated to provide a third comparison output at a drain of the third pair of complementary transistors; and (d) a controller operably coupled to the first, second, and third enabling transistors, wherein the controller disables the second and third enabling transistors when the first comparison output is a predetermined logic state, disables the first and third enabling transistors when the second comparison output is the predetermined logic state, disables the first and second enabling transistors when the third comparison output is the predetermined logic state, such that power consumption is minimized.

9. The multi-input low power comparator of claim 8 wherein the first, second, and third pair of transistors comprise p-channel field effect transistors and the first, second, and third complementary pair of transistors comprise n-channel field effect transistors.

10. The multi-input low power comparator of claim 8 wherein the first, second, and third pair of transistors comprise pnp bipolar transistors and the first, second, and third complementary pair of transistors comprise npn bipolar transistors.

11. The multi-input low power comparator of claim 8 wherein the first, second, and third pair of transistors comprise p-channel field effect transistors and the first, second, and third complementary pair of transistors comprise n-channel field effect transistors.

12. The multi-input low power comparator of claim 8 wherein the controller provides an enabling signal to the first enabling transistor when the first comparison output is produced and wherein the enabling signal is based on a clock signal.

13. The multi-input low power comparator of claim 8 wherein the controller provides an enabling signal to the second enabling transistor when the second comparison output is produced and wherein the enabling signal is based on a clock signal.

14. The multi-input low power comparator of claim 8 wherein the controller provides an enabling signal to the third enabling transistor when the third comparison output is produced and wherein the enabling signal is based on a clock signal.

15. The multi-input low power comparator of claim 8 wherein the controller comprises at least three AND gates with the controller having a clock signal, the first comparison output, the second comparison output, and the third comparison output as its inputs.

16. A method for comparing signals to produce a comparison output of a predetermined logic state, the method comprising the steps of:

(a) coupling a first input signal to a first stage that includes a first pair of transistors coupled to a first pair of complementary transistors through a first enabling transistor;

(b) coupling a second input signal to a second stage that includes a second pair of transistors coupled to a second pair of complementary transistors through a second enabling transistor, the second pair of transistors for providing positive feedback to the first pair transistors and the second pair of complementary transistors coupled to provide positive feedback to the first pair of complementary transistors;

(c) producing a first comparison output at a drain of the first pair of complementary transistors when the first input signal is greater than the second input signal by activating at least one of the first pair of complementary transistors;

(d) producing a second comparison output at a drain of the second pair of complementary transistors when the second input signal is greater than the first input signal by activating at least one of the second pair of complementary transistors; and (e) disabling the second enabling transistor when the first comparison output is the predetermined logic state while the first enabling transistor is enabled, and disabling the first enabling transistor while the second enabling transistor is enabled when the second comparison output is the predetermined logic state, such that power consumption is minimized.

17. A method for comparing multiple input signals to produce a comparison output, the method comprising the steps of:

(a) coupling a first input signal to a first stage that includes a first pair of transistors coupled to a first pair of complementary transistors through a first enabling transistor;

(b) coupling a second input signal to a second stage that includes a second pair of transistors coupled to a second pair of complementary transistors through a second enabling transistor;

(c) coupling a third input signal to a third stage that includes a third pair of transistors coupled to a third pair of complementary transistors through a third enabling transistor, wherein the second and third pair of transistors and the second and third pair of complementary transistors are coupled to provide positive feedback to the first pair of transistors and the first pair of complementary transistors of the first stage, respectively;

(d) producing a first comparison output by activating at least one of the first pair of complementary transistors when the first input signal is greater than the second input signal;

(e) producing a second comparison output by activating at least one of the second pair of complementary transistors when the second input signal is greater than the first input signal;

(f) producing the first comparison output by activating at least one of the first pair of complementary transistors when the first input signal is greater than the third input signal;

(g) producing a third comparison output by activating at least one of the third pair of complementary transistors when the third input signal is greater than the first input signal;

(h) disabling the second and third enabling transistors when the first comparison output is produced;

(i) disabling the first and third enabling transistors when the second comparison output is produced; and (j) disabling the first and the second enabling transistors when the third comparison output is produced.

* * * * *